United States Patent [19]  [11] Patent Number: 6,068,517
Tanaka  [45] Date of Patent: May 30, 2000

[54] CONNECTORS HAVING IMPROVED FITTING SPACES AND SUCTION NOZZLE CONVEYING SURFACES

[75] Inventor: Shoichi Tanaka, Kakegawa, Japan

[73] Assignee: NEC Corporation, Tokyo, Japan

[21] Appl. No.: 08/989,631

[22] Filed: Dec. 12, 1997

[30] Foreign Application Priority Data

Dec. 17, 1996 [JP] Japan ................ 8-337233

[51] Int. Cl.⁷ ............................... H01R 24/00
[52] U.S. Cl. ................................. 439/660; 439/948
[58] Field of Search ........................... 439/74, 66, 44, 439/940, 660, 948

[56] References Cited

U.S. PATENT DOCUMENTS

| 4,364,618 | 12/1982 | Godsey | 439/65 |
| 5,525,072 | 6/1996 | Kunishi | 439/495 |
| 5,558,540 | 9/1996 | Kato et al. | 439/637 |
| 5,641,290 | 6/1997 | Yagi | 439/74 |
| 5,772,474 | 6/1998 | Yagi et al. | 439/660 |
| 5,842,874 | 12/1998 | Yagi et al. | 439/74 |

FOREIGN PATENT DOCUMENTS

| UMRED/03-043272 | 4/1991 | Japan. |
| UMRED/04-122425 | 11/1992 | Japan. |
| P/05-077186 | 3/1993 | Japan. |
| P/05-253878 | 10/1993 | Japan. |
| P/06-104033 | 4/1994 | Japan. |
| UMRED/06-052195 | 7/1994 | Japan. |
| P/06-251851 | 9/1994 | Japan. |
| UMR/3006449 | 11/1994 | Japan. |
| UMR/3014608 | 6/1995 | Japan. |
| UMRED/08-000439 | 2/1996 | Japan. |
| P/09-232064 | 9/1997 | Japan. |
| PTRP/10-510395 | 10/1998 | Japan. |

Primary Examiner—Lincoln Donovan
Assistant Examiner—Hae Moon Hyeon
Attorney, Agent, or Firm—Saghrue, Mion, Zinn, Macpeak & Seas, PLLC

[57] ABSTRACT

The invention offers a connector which does not require a sheet or suction aid to be attached to the connector when conveying the connector using a suction nozzle. That is, a female connector (10), capable of being conveyed by a suction nozzle (4) over a circuit board and placed onto the circuit board for surface mounting, comprising a housing (11) having a bottom wall portion (13) and a side wall portion (14) which extends upright from the bottom wall portion (13) to form a fitting space (15) therein; and a female-side conductor (12) having a first end portion (12b) leading inside the housing (11) and a second end portion (12c) leading outside of the housing (11); wherein the female-side conductor (12) is embedded inside the side wall portion (14) such that the front surface (12a) of the female-side conductor (12) is co-planar with the inner surface (14a) of the side wall portion (14) and is exposed to the fitting space (15); and an inner surface (13a) of the bottom wall portion (13) is a surface by which the suction nozzle (4) holds the female connector (10).

8 Claims, 12 Drawing Sheets

CONNECTORS HAVING IMPROVED FITTING SPACES AND SUCTION NOZZLE CONVEYING SURFACES

BACKGROUND OF THE INVENTION

1. Field of the Invention

The present invention relates to a connector which is suitable for use, for example, as a surface-mounted multipolar connector for connecting circuit boards. This application is based on Patent Application No. Hei 8-337233 filed in Japan, the content of which is incorporated herein by reference.

2. Background Art

As is commonly known, one means for achieving high-density mounting which is essential to the miniaturization of electronic devices is to use techniques such as surface mounting and automatic installation of electronic parts such as chip resistors or chip capacitors.

This type of surface mounting and automatic installation is performed in the following manner.

As shown in FIG. 17, electronic parts 3 are placed in a plurality of embossed portions 2a of a tape 2 wound about a reel 1, and the reel 1 is mounted onto a chip mounter which is not shown. Surface mounting and automatic installation are performed as shown in FIG. 18, wherein a suction nozzle 4 is moved downward to draw up an electronic part 3 placed in the embossed portion 2a of the tape 2 by means of the suction of the suction nozzle 4, then the electronic part 3 is conveyed above a printed circuit board, mounted on the printed circuit board, and reflow soldered thereon.

On the other hand, miniaturization and high-density mounting are required not only for electronic parts such as chip resistors and chip capacitors, but also for multipolar connectors for making connections between circuit boards.

Therefore, conventional processes such as those shown in FIGS. 19 through 21 are known for performing surface mounting and automatic installation of multipolar connectors while using chip mounters such as are used for electronic parts such as chip resistors and chip capacitors.

FIG. 19 shows an example of the conventional art, as proposed in Japanese Utility Model Application, First Publication No. Hei 6-31079. In the drawing, reference numeral 5 denotes a receptacle connector and reference numeral 6 denotes a sheet. The receptacle connector 5 is composed of a housing 7 and a terminal 8. The housing 7 has a receptacle portion 7a. The terminal 8 has an L-shaped structure and is affixed with one end protruding into the receptacle portion 7a. The sheet 6 is adhered to the top surface of the housing 7. Due to this structure, the receptacle connector 5 can be conveyed together with the sheet 6 by holding the top surface of the sheet 6 by means of a suction nozzle 4.

FIG. 20 shows another example of the conventional art, proposed in Japanese Utility Model Application, First Publication No. Hei 5-31188. In this conventional art, a suction aid 9 is fitted into the receptacle portion 7a of the housing 7 of the receptacle connector 5, and the receptacle connector 5 can be conveyed together with the suction aid 9 by holding the top surface of the suction aid 9 by means of a suction nozzle 4.

FIG. 21 shows a third example of the conventional art, proposed in Japanese Patent Application, First Publication No. Hei 4-217400. In this conventional art, the receptacle connector 5 can be held by forming the tip surface of the suction nozzle such as to be capable of entirely covering the top surface of the receptacle connector 5.

However, the conventional art examples described above have the following drawbacks.

In the art shown in FIG. 19, after the top surface of the sheet 6 is held by means of the suction nozzle 4 and the receptacle connector is conveyed, placed on a circuit board and soldered on, the sheet 6 which becomes unnecessary must be removed. Since the work of removing this sheet 6 is extremely complicated, the work efficiency is largely reduced.

Similarly, in the second example shown in FIG. 20, the work of removing the suction aid 9 is required and the work efficiency is reduced.

In the third example shown in FIG. 21, since the shape of the suction nozzle 4 depends on the shape of the receptacle connector 5 which is to be held, the same suction nozzle 4 cannot be used for receptacle connectors having different shapes or for other electronic parts such as chip resistors and chip capacitors. Therefore, suction nozzles of various shapes corresponding to all of the types of receptacle connectors to be held must be readied, thus increasing the production costs.

SUMMARY OF THE INVENTION

The present invention has been made in consideration of the above-mentioned problems, and has the object of offering a conveyable connector which can be easily held by using a suction nozzle used for electronic parts such as chip resistors and chip capacitors without complicating the production process.

The connector of the present invention includes the following aspects in order to resolve the above-described problems.

A female connector according to a first aspect is capable of being conveyed by a suction nozzle over a circuit board and placed onto the circuit board for surface mounting, and comprises a housing having a bottom wall portion and a side wall portion which extends upright from the bottom wall portion to form a fitting space therein; and a female-side conductor having a first end portion leading inside the housing and a second end portion leading outside of the housing; wherein the female-side conductor is embedded inside the side wall portion such that the front surface of the female-side conductor is co-planar with the inner surface of the side wall portion and is exposed to the fitting space; and an inner surface of the bottom wall portion is a surface by which the suction nozzle holds the female connector.

According to this first aspect of the invention, a suction nozzle can convey the female connector by being inserted into the fitting space and holding the inside of the bottom wall portion of the housing, thereby offering a female connector which can be easily held and conveyed using suction nozzles normally used to convey electronic parts such as chip resistors and chip capacitors. Additionally, since the female conductors are embedded into the side wall portions with their surfaces roughly co-planar with the inner surface of the side wall portion and exposed to the fitting space, the fitting space can be made large so as to enable the suction nozzle to be easily inserted into the fitting space.

A female connector according to a second aspect is capable of being conveyed by a suction nozzle over a circuit board and placed onto the circuit board for surface mounting, and comprises a housing having a bottom wall portion and a side wall portion which extends upright from the bottom wall portion to form a fitting space therein; and a female-side conductor having a first end portion leading inside the housing and a second end portion leading outside of the housing; wherein a projecting portion having a flattened projecting end surface and projecting in an upright direction of the side wall portion is formed on an inner surface of the bottom wall portion, and the projecting end surface is a surface by which the suction nozzle holds the female connector.

According to this second aspect of the invention, a suction nozzle can convey the female connector by holding the projecting end surface on the projecting portion which projects in the upright direction of the side wall portion from the inner surface of the bottom wall portion of the housing. This structure is especially effective when the distance of movement of the suction nozzle is shorter than the length from the inner surface of the bottom wall portion to the upper surface of the side wall portion.

A male connector according to a third aspect is capable of being conveyed by a suction nozzle over a circuit board and placed onto the circuit board for surface mounting, and comprises a plug member; and a male-side conductor provided on an external surface of the plug member; wherein the plug member has a tip surface which is flattened and the male-side conductor is provided on a side surface which extends backward from a peripheral portion of the tip surface; the plug member is capable of freely fitting into the fitting space with the female-side conductor and the male-side conductor being in mutual contact; and the tip surface is a surface by which the suction nozzle holds the female connector.

According to this third aspect of the invention, a suction nozzle can convey the male connector by holding the tip surface of the plug member, and the male connector can be freely fitted into the fitting space provided in the female connector according to the first aspect of the present invention.

A male connector according to a fourth aspect is capable of being conveyed by a suction nozzle over a circuit board and placed onto the circuit board for surface mounting, and comprises a plug member; and a male-side conductor provided on an external surface of the plug member; wherein the plug member has a tip surface which is flattened and the male-side conductor is provided on a side surface which extends backward from a peripheral portion of the tip surface; the plug member is capable of freely fitting into the fitting space with the female-side conductor and the male-side conductor being in mutual contact; the tip surface is a surface by which the suction nozzle holds the female connector; and a fitting recess portion is formed on the plug member at a position corresponding to the projecting portion.

According to this fourth aspect of the present invention, a suction nozzle can convey the male connector by holding the fitting recess portion formed on the tip surface of the plug member, and the male connector can be freely fitted with the female connector according to the second aspect of the present invention, due to the fitting recess portion formed at a position corresponding to the projecting portion of the female connector, thereby extending the overlapping length during connection and allowing for a stable and reliable connection.

DESCRIPTION OF PREFERRED EMBODIMENTS OF THE INVENTION

Figure 1:
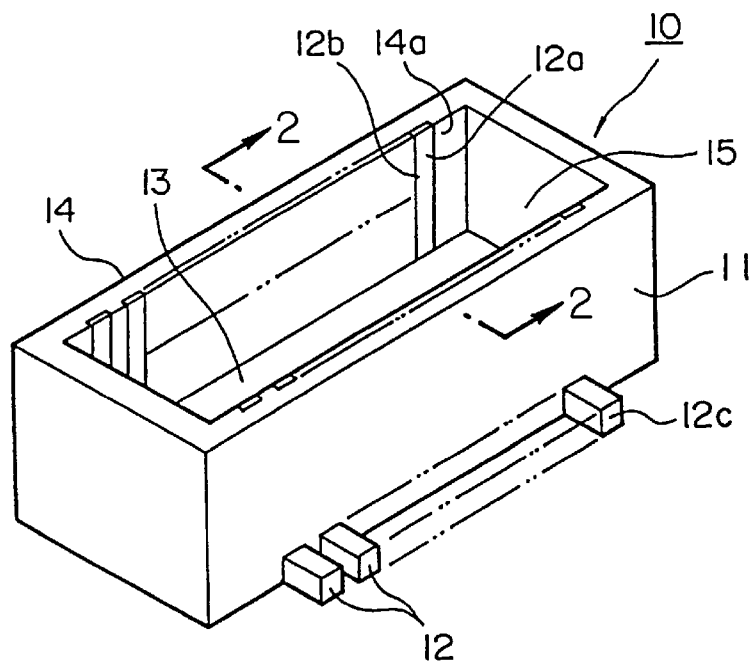
FIG. 1 is a perspective view showing a first embodiment of a female connector according to the present invention.
Figure 2:
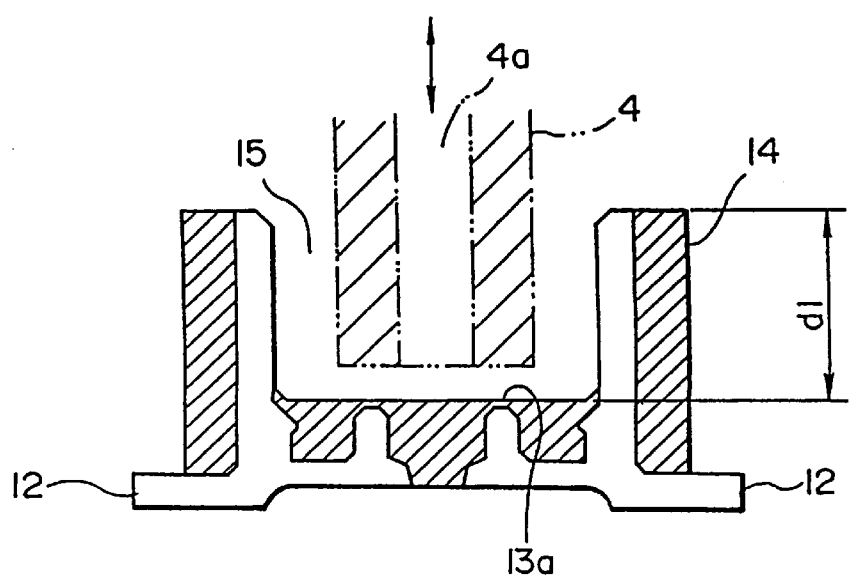
FIG. 2 is a section view across 2—2 of the female connector shown in FIG. 1.

Hereinbelow, a first embodiment of the present invention shall be explained with reference to FIGS. 1–5. FIG. 1 is a perspective view showing the first embodiment of the present invention, wherein reference numeral 10 denotes a receptacle connector (female connector). The receptacle connector 10 comprises a housing 11 and a plurality of fixed terminals (female-side conductors) 12. The housing 11 comprises a bottom wall portion 13 and a side wall portion 14 which extends upright from the bottom wall portion 13 so as to form a fitting space 15 therein. The bottom wall portion 13 extends in a horizontal direction and has a flat inner surface 13a. The length d1 from the inner surface 13a of this bottom wall portion 13 to the upper end of the side wall portion 14 is shorter than the distance of movement of the suction nozzle 4 to be described below. The fitting space 15 is formed so as to be larger than the outer dimension of the suction nozzle 4 in order to enable insertion of the suction nozzle 4. Each fixed terminal 12 is shaped such that a first end portion 12b leads inside the housing 11 while a second end portion 12c leads outside the housing 11. The fixed terminals 12 are embedded within the side wall portion such that their front surfaces 12a are approximately co-planar with the inner surface 14a of the side wall portion 14 and are exposed to the fitting space 15. As shown in FIG. 2, a suction nozzle 4 has an internal hole 4a, and objects are capable of being held at the tip of the suction nozzle 4 by drawing them up when the internal hole 4a is connected to a vacuum source which is not shown.

Figure 3:
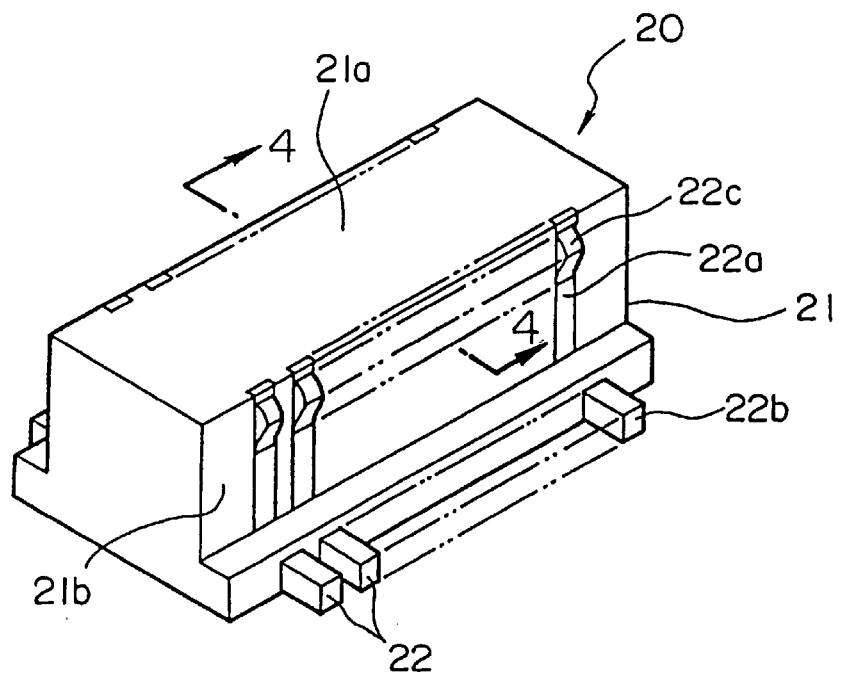
FIG. 3 is a perspective view showing a first embodiment of a male connector according to the present invention.
Figure 4:
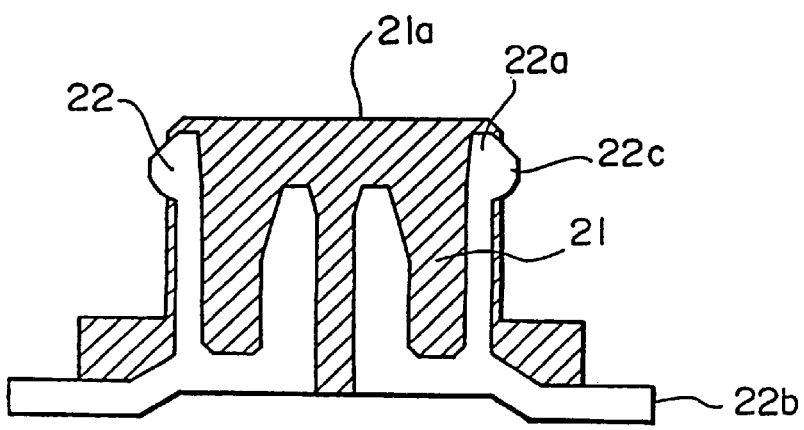
FIG. 4 is a section view across 4—4 of the male connector shown in FIG. 3.

FIG. 3 is a perspective view of a plug connector (male connector) 20 to be connected to the receptacle connector 10. The plug connector 20 comprises a plug member 21 and a plurality of movable terminals (male-side conductors) 22. The plug member 21 has a tip surface 21a which is flat, and a side surface 21b which extends backward from the peripheral portions of the tip surface such as to form a convex shape. The plug member 21 has a shape which enables the tip surface 21a to be freely fitted into the fitting space 15 of the receptacle connector 10. The tip surface 21a is flat and has an area sufficiently larger than the tip surface of the suction nozzle 4 so as to capable of being held by the suction nozzle 4. Each movable terminal 22 is shaped such that a first end portion 22a is provide in the side surface 21b, and a second end portion 22b leads outside the plug member 21. The first end portion 22a is provided with a contact portion 22c which protrudes outward from the side surface 21b so as to be capable of contacting a fixed terminal of the receptacle connector 10. Each of the movable terminals 22 are capable of electrically connecting with the fixed terminals 12 of the receptacle connector 10 when the plug connector 20 is connected with the receptacle connector 10.

Figure 5:
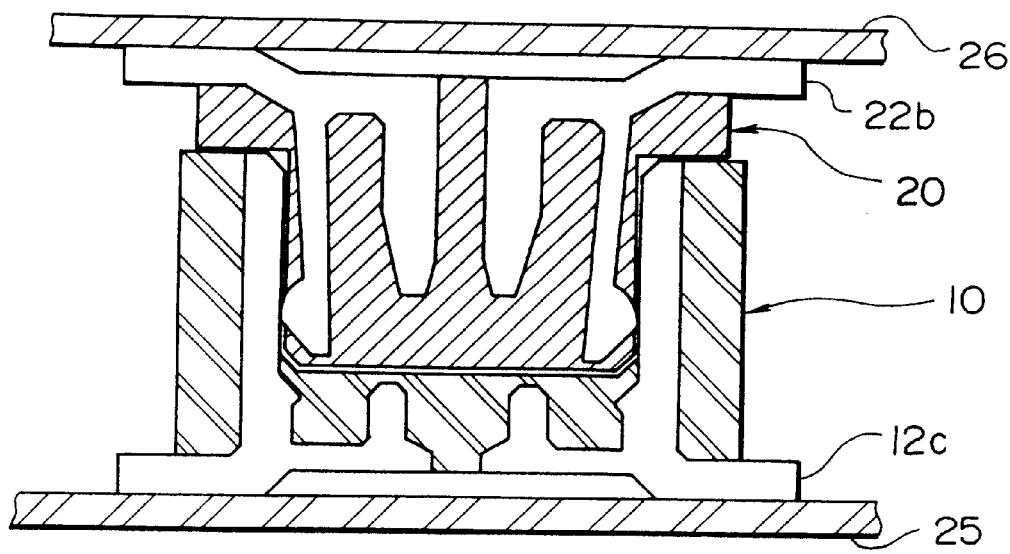
FIG. 5 is a section view showing a state of connection between the female connector and male connector according to the first embodiment of the present invention.

FIG. 5 is a section view showing a state of contact between the receptacle connector 10 and the plug connector 20. The receptacle connector 10 is affixed to a circuit board 25 by soldering the second end portions 12c of the fixed terminals 12 onto the circuit board 25. Similarly, the plug connector 20 is affixed to a circuit board 26 by soldering the second end portions 22b of the movable terminals 22. The circuit boards 25 and 26 can be connected by using the receptacle connector 10 and the plug connector 20 in this manner.

Figure 6:
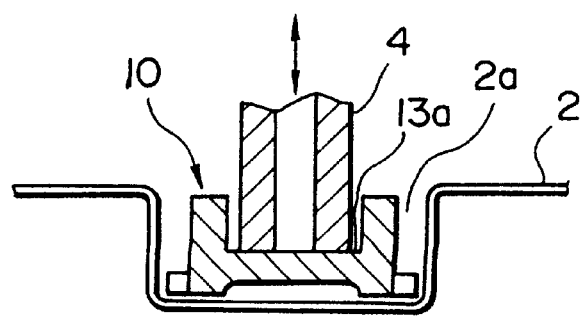
FIG. 6 is a section view showing a female connector being held by a suction nozzle.
Figure 17:
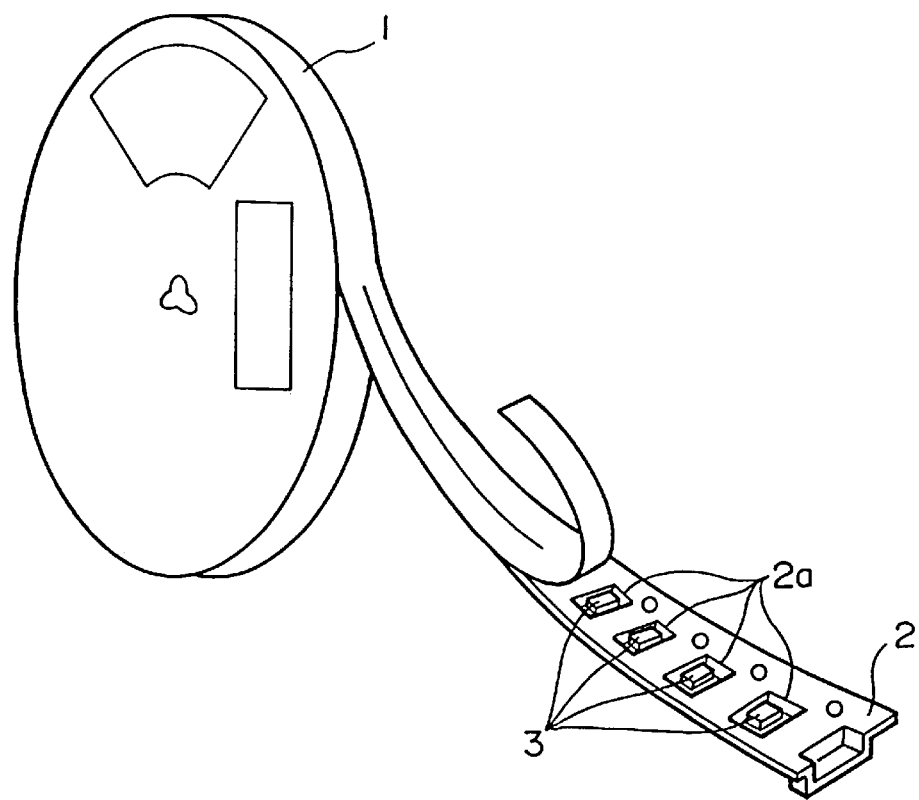
FIG. 17 is a perspective view showing electronic parts placed on an embossed portion of a tape.
Figure 18:
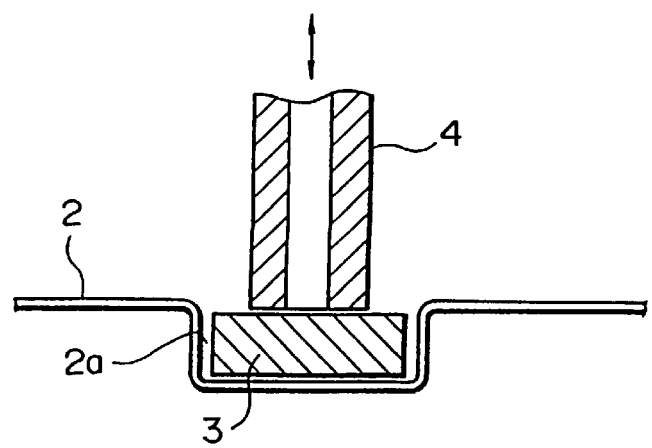
FIG. 18 is a section view showing an electronic part as shown in FIG. 17 being held by a suction nozzle.
Figure 19:
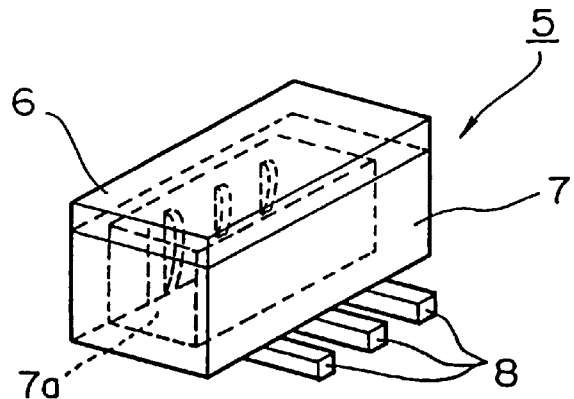
FIG. 19 is a perspective view showing a first example of the conventional art.
Figure 20:
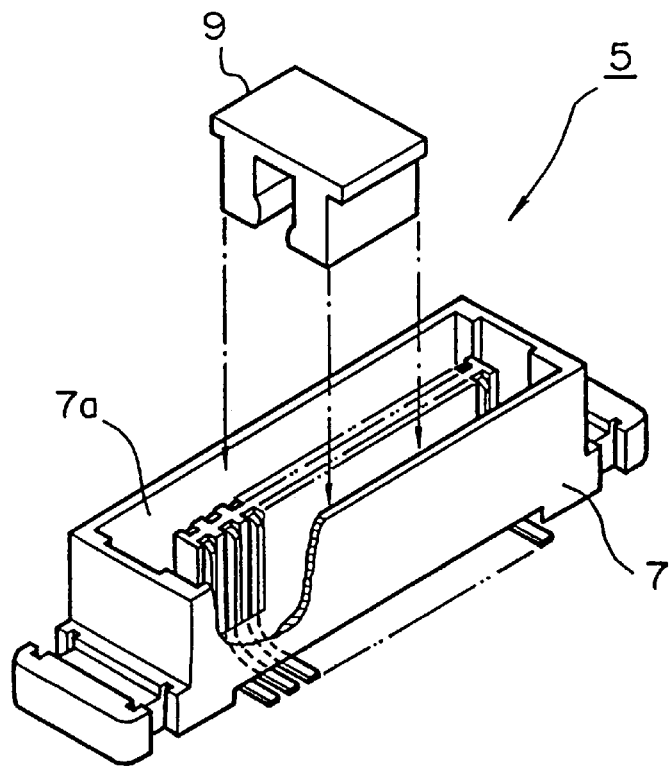
FIG. 20 is a perspective view showing a second example of the conventional art.
Figure 21:
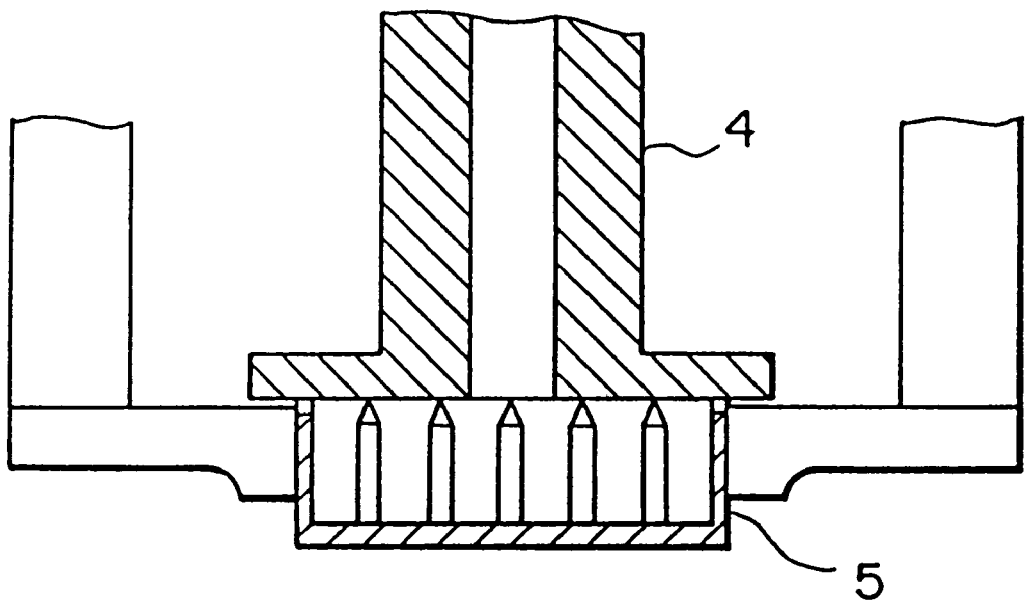
FIG. 21 is a section view showing a third example of the conventional art.

Next, a method for conveying a receptacle connector 10 having the above-described structure by means of the suction nozzle 4 shall be explained with reference to FIG. 6. In this drawing, the parts which are analogous to those shown in FIG. 18 have been given the same reference numerals, and their descriptions shall be omitted. A receptacle connector 10 is placed in an embossed portion 2a formed in a tape 2 in a reel 1 (see FIG. 17). The suction nozzle 4 is constructed such as to be capable of moving up and down with respect to the receptacle connector by means of a chip mounter which is not shown. The receptacle connector 10 is drawn and held when the suction nozzle 4 is moved downward to a position at which the tip of the suction nozzle 4 achieves contact with the inner surface 13a of the bottom wall portion 13 of the receptacle connector 10. Then, after being conveyed to the circuit board, the receptacle connector is installed on the circuit board and surface mounted by means of reflow soldering.

The plug connector 20 shown in FIG. 3 is also conveyed by drawing and holding the tip surface 21a of the plug member 21 by means of the suction nozzle 4 in a manner similar to the conveyance of the receptacle connector 10.

As described above, the receptacle connector 10 according to the first embodiment of the present invention is such that the inner surface 13a of the bottom wall portion 13 of the receptacle connector is flattened and the fitting space 15 is of a size such as to allow insertion of the suction nozzle 4, thereby enabling the suction nozzle 4 to be inserted into the fitting space 15 in order to hold the inner surface 13a of the bottom wall portion 13. Additionally, the fixed terminals 12 of the receptacle connector 10 are arranged such that the front surfaces 12a of the fixed terminals are roughly co-planar with the inner surface of the side wall portion 14, thus allowing the fitting space 15 to be large so as to enable the suction nozzle 4 to be readily inserted into the fitting space 15. The plug connector 20 of the first embodiment is capable of being connected with the receptacle connector 10 and is such that the tip surface 21a is flattened and has an area larger than the tip of the suction nozzle 4, thereby allowing for conveyance by the suction nozzle 4 with the tip surface 21a as the holding surface.

Figure 7:
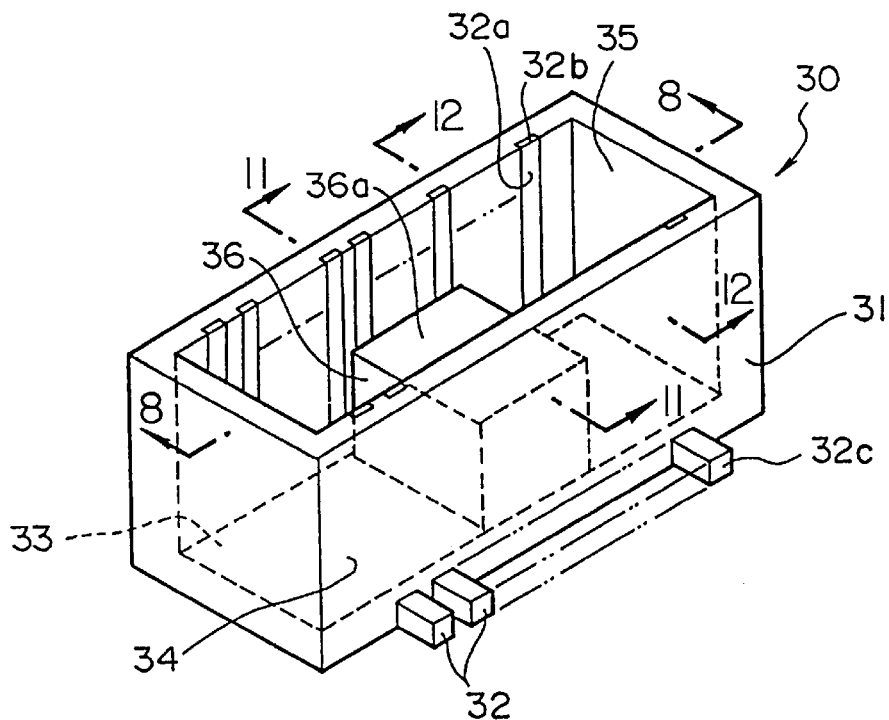
FIG. 7 is a perspective view showing a second embodiment of a female connector according to the present invention.

Next, a second embodiment of the present invention shall be explained with reference to FIGS. 7–12. FIG. 7 is a perspective view of a receptacle connector 30. The receptacle connector 30 comprises a housing 31 and a plurality of fixed terminals (female-side conductors) 32. The housing 31 comprises a bottom wall portion 33 and a side wall portion 34 which extends upright from the bottom wall portion 33 to form a fitting space 35 therein. Inside the fitting space 35, a projecting portion 36 having a flattened projecting end surface 36a projects from an inner surface 33a of the bottom wall portion 33 in the upright direction of the side wall portion 34. The length d2 from the projecting end surface 36a to the upper end of the side wall portion 34 is such as to enable a suction nozzle 4 to reach the projecting end surface 36a (see FIG. 8). The area of the projecting end surface 36a of the projecting portion 36 is larger than that of the tip of the suction nozzle 4. The fitting space 35 is large enough to insert the suction nozzle 4. Each fixed terminal 32 is shaped such as to have a first end portion 32b which leads inside the housing 31 and a second end portion 32c which leads outside the housing 31. These fixed terminals 32 are embedded in the side wall portion 34 such that their front surfaces 32a are roughly co-planar with the inner surface of the side wall portion 34 and exposed to the fitting space 35.

Figure 9:
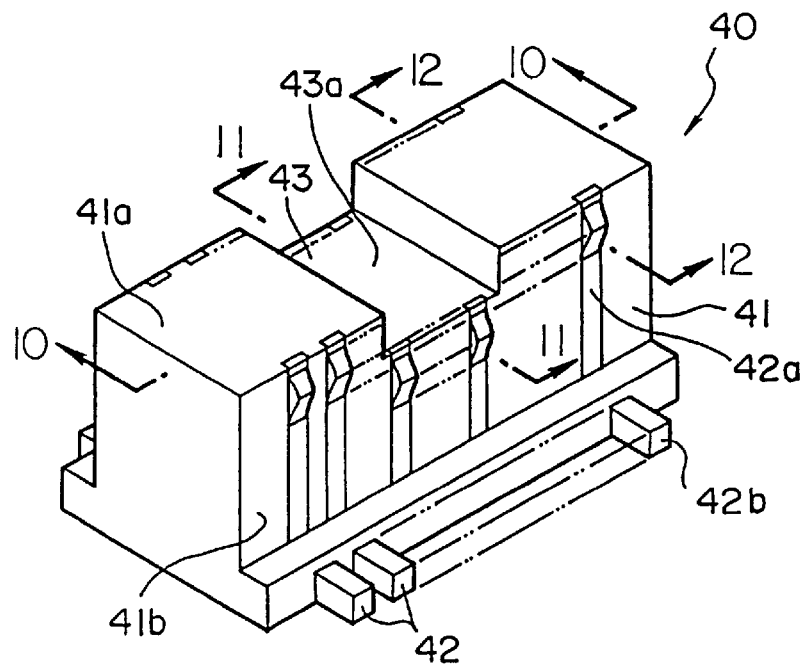
FIG. 9 is a perspective view showing a second embodiment of a male connector according to the present invention.

FIG. 9 is a perspective view of a plug connector (male connector) 40 to be connected to the receptacle connector 30. The plug connector 40 comprises a plug member 41 and a plurality of movable terminals (male-side conductors) 42. The plug member 41 has a flat tip surface 41a with a side surface 41b which extends backward from a peripheral portion of the tip surface 41a to form a convex shape. In roughly a central portion of the tip surface 41a of this plug member 40, a fitting recess portion 43 is formed at a position corresponding to the projecting portion 36 of the receptacle connector 30, with the tip surface 41a being capable of freely fitting into the fitting space 35 of the receptacle connector 30. The fitting recess portion 43 has a space larger than the tip of the suction nozzle 4 and the bottom surface 43a of the fitting recess portion 43 is flattened so as to enable it to be held by the suction nozzle 4 (see FIG. 10). The movable terminals 42 are shaped such as to have a first end portion 42a which is provided in the side surface 41b and a second end portion 42b which leads outside the plug member 41. The plurality of moving member 42 are capable of electrically connecting with the fixed terminals 32 of the receptacle connector 30 when the plug connector 40 is connected to the receptacle connector 30. The distance d3 from the bottom surface 43a of the fitting recess portion 43 to the tip surface 41a is such as to enable the suction nozzle to reach the bottom surface 43a (see FIG. 10).

Figure 10:
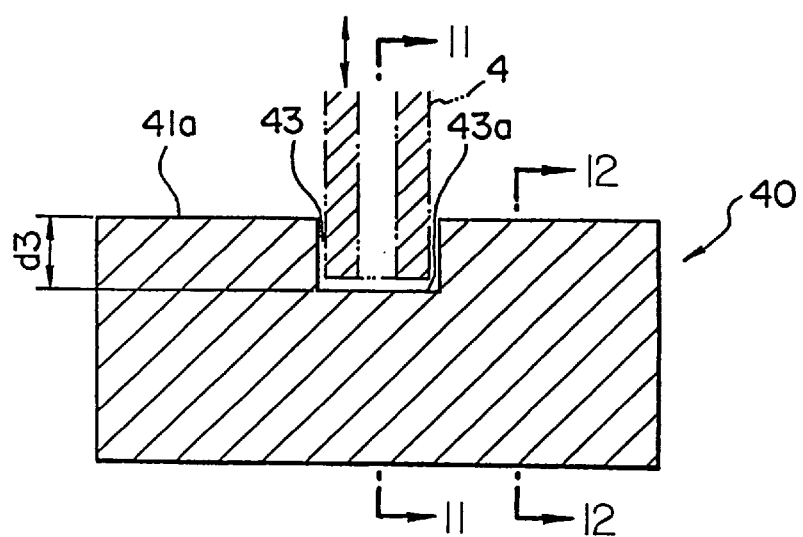
FIG. 10 is a section view across 10—10 of the male connector shown in FIG. 9.
Figure 11:
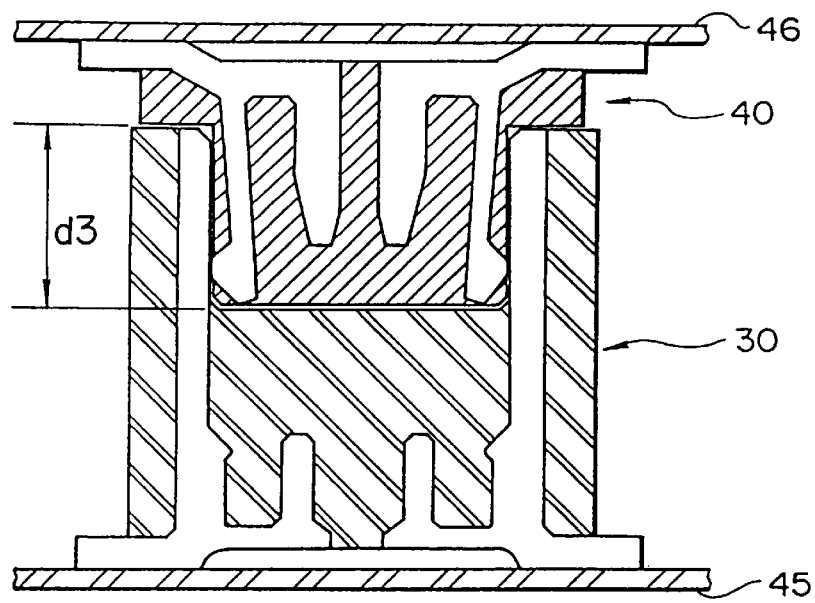
FIG. 11 is a section view across 11—11 showing a state of connection between the female connector shown in FIG. 7 and the male connector shown in FIG. 9 according to the second embodiment of the present invention.
Figure 12:
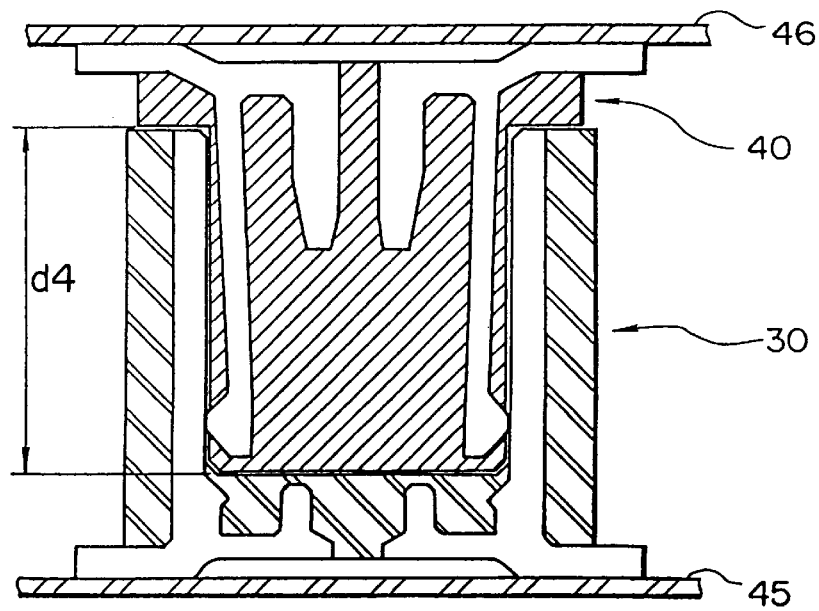
FIG. 12 is a section view across 12—12 showing a state of connection between the female connector shown in FIG. 7 and the male connector shown in FIG. 9 according to the second embodiment of the present invention.

FIGS. 11 and 12 show section views of the receptacle connector 30 and plug connector 40 in a state of connection. FIG. 11 is a section view across 11—11 in FIGS. 8 and 10, which is along a plane that includes the projecting portion 36 and the fitting recess portion 43. The receptacle connector 30 and plug connector 40 are respectively affixed to the circuit boards 45 and 46 by soldering as explained with reference to FIG. 5 for the first embodiment. The receptacle connector 30 and the plug connector 40 are connected with an overlapping length of d3. FIG. 12 is a section view across 12—12 in FIGS. 8 and 10, which is along a plane that does not include the projecting portion 36 and the fitting recess portion 43, connected with an overlapping length of d4. This overlapping length d4 is longer than the overlapping length d3 of FIG. 11.

Figure 8:
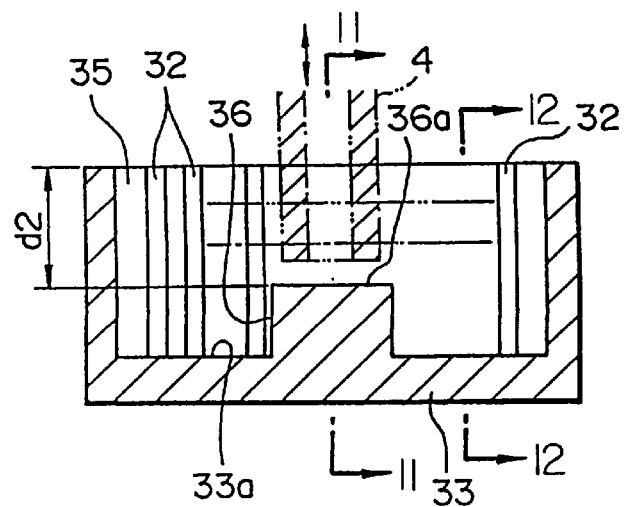
FIG. 8 is a section view across 8—8 of the female connector shown in FIG. 7.

As shown in FIG. 8, the receptacle connector 30 is conveyed by moving the suction nozzle 4 to bring the tip of the suction nozzle 4 into contact with the projecting end surface 36a of the projecting portion 36, and drawing the projecting end surface 36a against the suction nozzle 4. Similarly, as shown in FIG. 10, the plug connector 40 is conveyed by moving the suction nozzle 4 to bring the tip of the suction nozzle 4 into contact with the bottom surface 43a of the fitting recess portion 43, and drawing the bottom surface 43a against the suction nozzle 4.

The receptacle connector 30 according to the second embodiment is provided with a projecting portion 36 inside the fitting space 35, thereby allowing for conveyance by the suction nozzle 4 with the projecting end surface 36a of the projecting portion 36 as the holding surface. Additionally, the length d2 from the projecting end surface 36a to the upper end of the side wall portion 34 is such as to enable the suction nozzle 4 to reach, thus allowing a suction nozzle 4 to be used even when the depth from the bottom wall portion 33 to the top surface of the side wall portion 34 is greater than the distance over which the suction nozzle 4 is capable of moving up and down.

The plug connector 40 according to the second embodiment is a connector capable of being connected with the receptacle connector 30 due to the provision of a fitting recess portion 43, and is capable of being conveyed by a suction nozzle 4 with the bottom surface 43a of the fitting recess portion 43 as the holding surface. Additionally, by using the receptacle connector 30 and plug connector 40 in combination, the overlapping length d4 can be made large so as to give a firm connection.

Next, examples of applications for the connectors 10, 20, 30 and 40 described above shall be explained. If all of the parts in a device are mounted on a single printed circuit board, then the size and dimensions of the printed circuit board must be large, thus forcing the size and dimensions of the device itself to be enlarged and reducing the applicability of the device. The connectors 10, 20, 30 and 40 according to the present invention are used in order to avoid such problems. They can be used in order to interconnect two printed circuit boards inside portable electronic devices as explained below.

Figure 13:
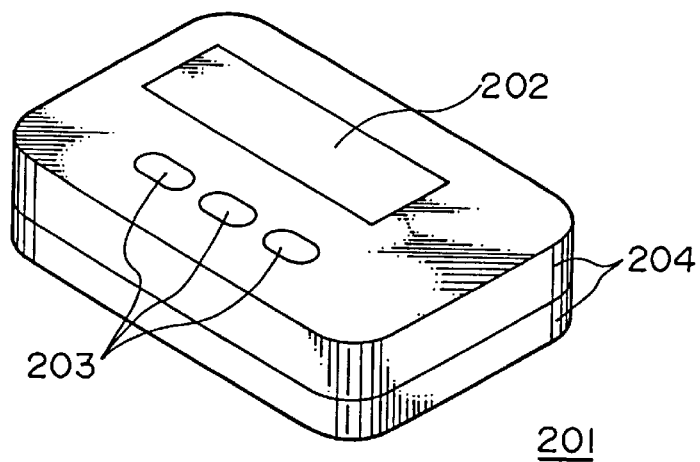
FIG. 13 is a perspective view of the outward appearance of a pager.
Figure 14:
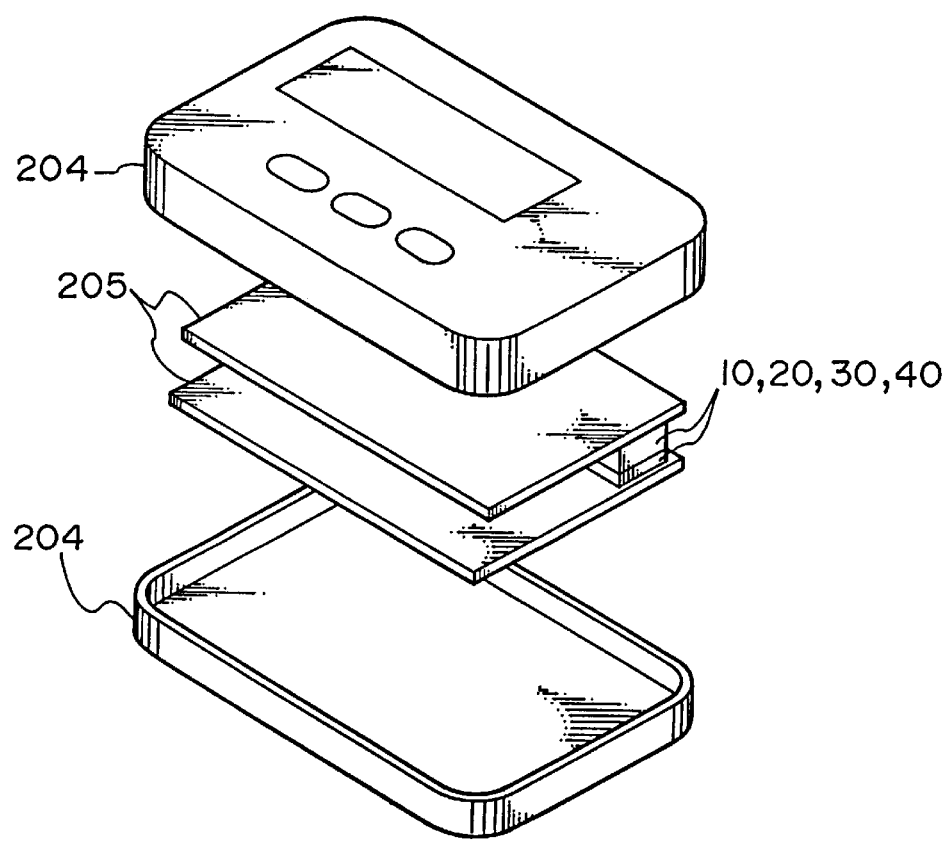
FIG. 14 is an exploded view of the pager shown in FIG. 13.
Figure 15:
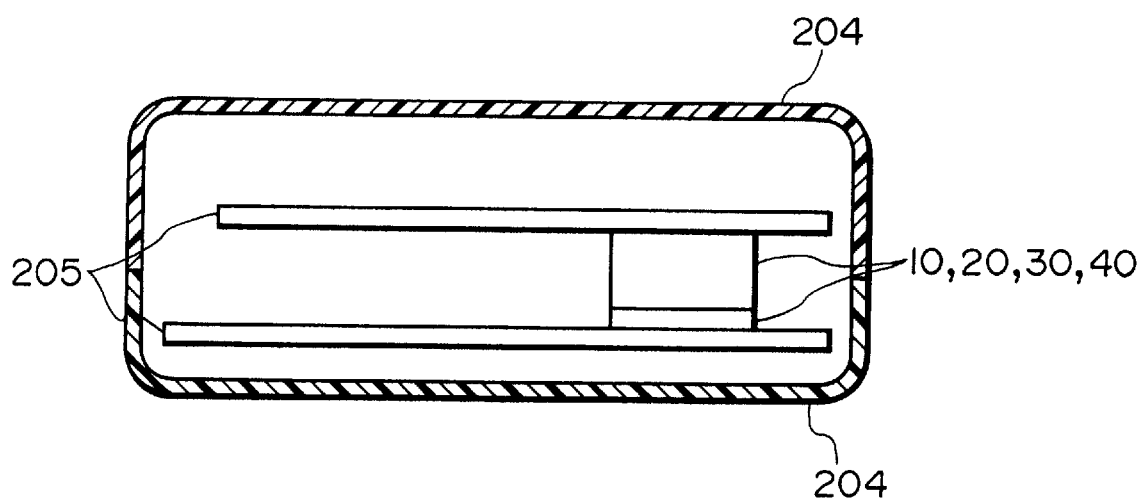
FIG. 15 is a section view of the pager shown in FIG. 13.

While portable electronic devices generally include cellular telephones, PHS's, PDA's, personal computers and pagers, the following example shall describe a case in which the connectors according to the present invention are used in a pager. FIG. 13 is a perspective view of the exterior of a pager, FIG. 14 is an exploded view of a pager, FIG. 15 is a section view of a pager, and FIG. 16 is a block diagram of a pager.

Figure 16:
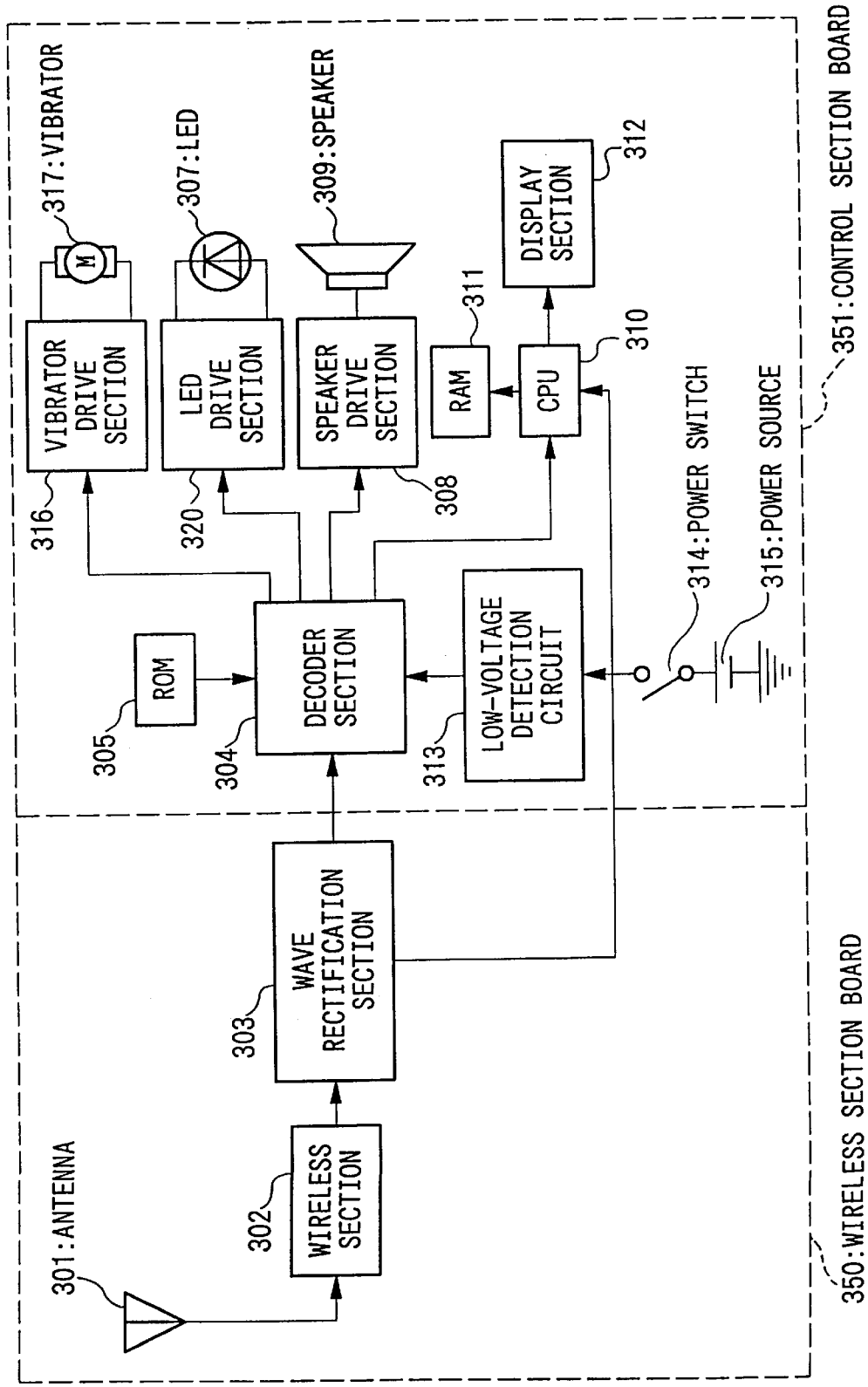
FIG. 16 is a block diagram of the pager shown in FIG. 13.

As shown in FIG. 16, the pager 201 comprises the respective blocks of an antenna 301, a wireless section 302, a wave rectification section 303, a decoder section 304, a ROM 305, a CPU 310, a RAM 311, a display section 312, a speaker drive section 308, a speaker 309, a LED drive section 320, an LED 307, a vibrator drive section 316, a vibrator 317, a low-voltage detection circuit 313, a power source switch 314 and a power source 315.

If these blocks are all mounted on a single printed circuit board, the circuit board becomes considerably large, making it difficult to achieve a pager with high portability. Therefore, as shown in FIG. 16, the blocks in the pager 201 are divided into a wireless section board 350 and a control section board 351. By connecting the two printed circuit boards 205 with the connectors 10, 20, 30 and 40 and mounting them inside a case 204 as shown in FIGS. 14 and 15, the size of each printed circuit board can be roughly halved in comparison to mounting on a single printed circuit board, thus enabling a pager with exceptional portability to be achieved.

Approximately 10–20 lines such as power lines or signal lines are required to connect the wireless section board 350 and the control section board 351. In this case, the lines can be easily interconnected by using the connectors 10, 20, 30 and 40 according to the present invention which have a plurality of terminals 12, 22, 32 and 42. Hence, high-density mounting and miniaturization of portable electronic devices is made possible by using the connectors of the present invention.

While a pager has been described as an example of application of the connectors of the present invention, the possible applications are of course not restricted to pagers. That is, the connectors according to the present invention can be applied to any devices wherein the blocks in the device are divided into two or more circuit boards and a plurality of lines must be interconnected in order to connect the circuit boards, such devices including cellular telephones, PHS's, PDA's and personal computers.

What is claimed is:

1. A female connector, capable of being placed onto a circuit board for surface mounting, comprising:

a housing having a bottom wall portion and at least one side wall portion which extends upright from said bottom wall portion to form a fitting space therein; and at least one female-side conductor having a first end portion leading inside said housing and a second end portion leading outside of said housing;

wherein a projecting portion, said projecting portion having a flattened projecting end surface projecting in an upright direction of said at least one side wall portion, wherein said projecting portion is formed on an inner surface of said bottom wall portion, and wherein said flattened projecting end surface is a suction surface by which said female connector can be conveyed, wherein said flattened projecting end surface is no higher from said bottom wall than a top end of said first end portion of said female-side conductor.

2. A male connector for connecting to a female connector according to claim 1, capable of placed onto the circuit board for surface mounting, comprising:

a plug member having a tip surface which is substantially flat; and at least one male-side conductor provided on an external surface of said plug member;

wherein a first end portion of said at least one male-side conductor is provided on a side surface which extends backward from a peripheral portion of said tip surface and a second end portion of said at least one male-side conductor extends outside of said plug member;

said plug member is capable of freely fitting into the fitting space with said at least one female-side conductor and said at least one male-side conductor being in mutual contact;

said tip surface is a suction surface by which said male connector can be conveyed; and a fitting recess portion is formed on said plug member at a position corresponding to the projecting portion.

3. A male connector in accordance with claim 2, wherein said at least one male-side conductor has a contact portion which protrudes outward from said side surface of said plug member.

4. A female connector in accordance with claim 1, wherein said second end portion of said at least one female-side conductor is connected to a circuit board.

5. A male connector in accordance with claim 2, wherein said second end portion of said at least one male-side conductor is connected to a circuit board.

6. A female connector in accordance with claim 1, wherein said female connector is used in a pager, for electrically connecting two printed circuit boards among a plurality of printed circuit boards disposed inside the pager.

7. A male connector, capable of placed onto a circuit board for surface mounting, comprising:

a plug member having a plurality of side wall portions each having proximal ends and distal ends, said proximal ends being affixed to a base portion and said distal ends being affixed to a top surface; and at least one male-side conductor provided on said plug member;

wherein a first end portion of said at least one male-side conductor is disposed to project beyond an exterior side surface of one of said side wall portions and a second end portion of said at least one male-side conductor extends outside of said plug member in a region adjacent to said top surface, wherein a fitting recess portion is formed in said top surface, wherein said fitting recess portion forms a suction surface by which said male connector can be conveyed, and wherein said fitting recess is dimensioned to receive a type of suction nozzle normally used to convey small electronic parts.

8. A male connector in accordance with claim 7, wherein said side wall portions and said tip surface are dimensioned to insertably provided within a fitting space of a female connector, wherein a housing of said female connector includes a bottom wall portion and at least one side wall portion which extends upright from said bottom wall portion to form a fitting space therein;

wherein at least one female-side conductor includes a first end portion leading inside said housing and a second end portion leading outside of said housing;

wherein a projecting portion formed on an inner surface of said bottom wall portion includes a flattened projecting end surface, wherein said flattened projecting end surface is a suction surface by which said female connector can be conveyed, and wherein said flattened projecting end surface is no higher from said bottom wall than a top end of said first end portion of said female-side conductor.

* * * * *